United States Patent [19]

Jerome et al.

[11] Patent Number: 4,517,121
[45] Date of Patent: May 14, 1985

[54] METHOD OF INCREASING THE SUPRACONDUCTIVE CRITICAL TEMPERATURE IN QUASI UNIDIMENSIONAL ORGANIC SUPRACONDUCTORS AND NEW SUPRACONDUCTIVE COMPOUNDS THUS OBTAINED

[75] Inventors: Denis Jerome, Jouy en Josas; Claude More, Vaison la Romaine; Guy-Roland Roger, Plan de Cuques; Jean-Pierre Sorbier, Marseilles; Jean-Marc Delrieu, Gif sur Yvette; Michel Ribault, Bures sur Yvette; Jean M. Fabre, Montpellier; André Fournel, St. Savournin; Louis Giral, Montpellier, all of France; Klaus Bechgaard, Aabovaenge, Denmark

[73] Assignee: Centre National de la Recherche Scientifique, Paris, France

[21] Appl. No.: 479,068

[22] PCT Filed: Jul. 21, 1982

[86] PCT No.: PCT/FR82/00123
§ 371 Date: Mar. 22, 1983
§ 102(e) Date: Mar. 22, 1983

[87] PCT Pub. No.: WO83/00410
PCT Pub. Date: Feb. 3, 1983

[30] Foreign Application Priority Data

Jul. 22, 1981 [FR] France .................... 81 14291

[51] Int. Cl.$^3$ .............. C07F 9/90; C07F 5/06; C07F 7/24; C07F 1/12
[52] U.S. Cl. .................................... 260/239 R
[58] Field of Search ........... 260/429 R, 430, 448 R, 260/435, 239 R; 568/8

[56] References Cited

U.S. PATENT DOCUMENTS

| | | | |
|---|---|---|---|
| 3,765,882 | 10/1973 | Virkhaus | 260/239 R X |
| 3,905,958 | 9/1975 | Gunther | 260/239 R |
| 3,984,593 | 10/1976 | Hilti et al. | 260/239 R |

OTHER PUBLICATIONS

Chemical Abstracts 84, 135562q, (1976).
Chemical Abstracts 91, 192326j, (1979).
Chemical Abstracts 86, 99384p, (1977).
Chemical Abstracts 93, 248884a, (1980).
Chemical Abstracts 88, 152505y, (1977).
Chemical Abstracts 90, 186049j, (1978).
D. Jerome, A. Mazaud, M. Ribault, Superconductivity in a Synthetic Organic Conductor (TMTSE)$_2$PF$_6$(+), Physics Abstracts-Letters 41, 1980, pp. L95-L98.
Dominique Jerome, Les Conducteurs Organiques des Materiaux d'Avenir-La Recherche, vol. 11, No. 116, Nov. 1980, (Paris, FR), pp. 1334-1336.
Ribault et al., Supraconductivite et Absence d'Anomalie de Kohn dans le Conducteur Organique Quasi Unidimensionnel: (TMTSF)$_2$AsF$_6$ Comptes Rendus, Series A & B Sciences Mathematiques & Physique, vol. 291, No. 5, Oct. 1980, (Paris FR), pp. 145-148.

*Primary Examiner*—Helen M. S. Sneed
*Attorney, Agent, or Firm*—Cushman, Darby & Cushman

[57] ABSTRACT

A process for increasing the critical supraconductive temperature of the organic molecular crystalline compound (TMTSF)$_2$X in which TMTSF is di-2,2'-bi-4,5-dimethyl-1,3-diselenol and X is ClO$_4$, PF$_6$, TaF$_6$, SbF$_6$, AsF$_6$ or ReO$_4$ comprising cross-linking the chains of the crystalline compound with at least one metal selected from gold, silver, aluminum, lead, indium, gallium or selenium.

6 Claims, 7 Drawing Figures

Fig. 1
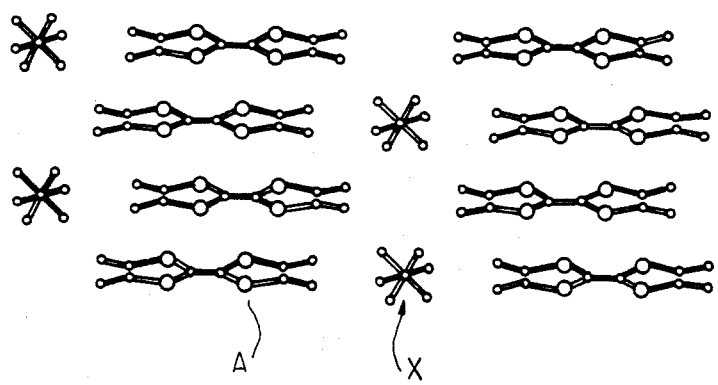
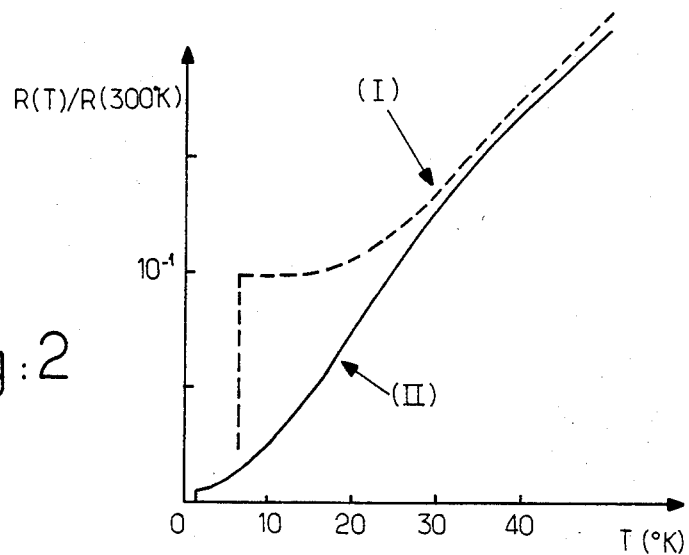
Fig. 2
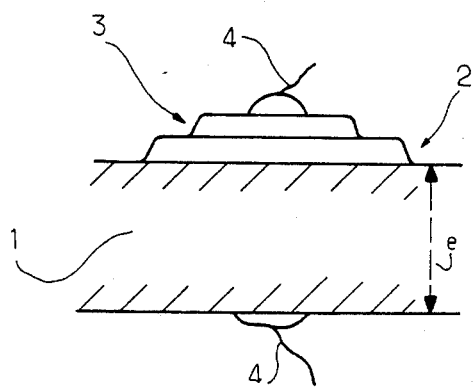
Fig. 3

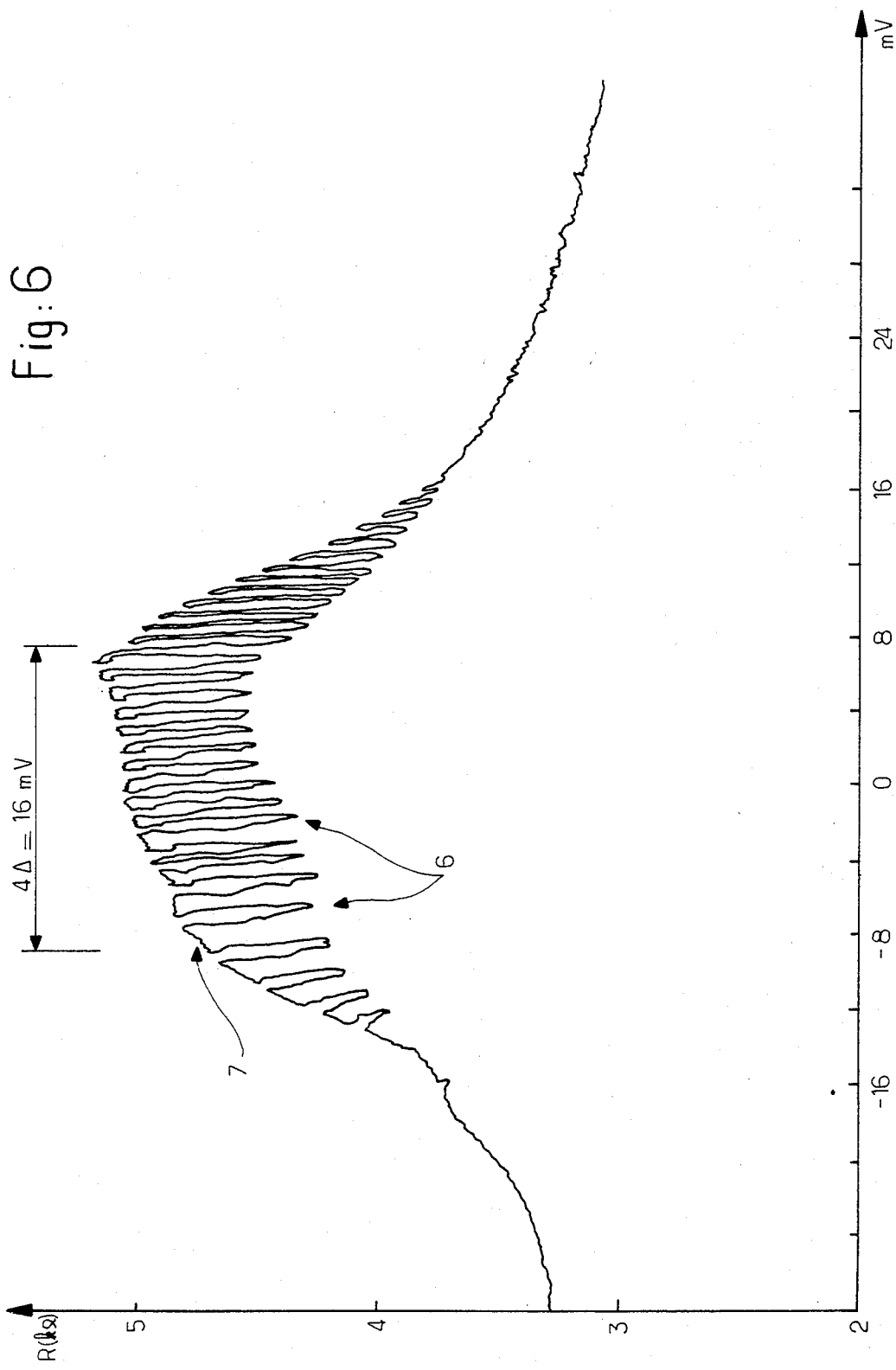

METHOD OF INCREASING THE SUPRACONDUCTIVE CRITICAL TEMPERATURE IN QUASI UNIDIMENSIONAL ORGANIC SUPRACONDUCTORS AND NEW SUPRACONDUCTIVE COMPOUNDS THUS OBTAINED

The present invention relates to supraconductive compounds and more particularly to a process for increasing the supraconductive critical temperature in organic quasi-one-dimensional supraconductive compounds and the organic supraconductive compounds thus obtained.

The supraconductive properties provided by certain bodies at very low temperatures and observed for the first time, when occurring on mercury, in 1911 by Kamerlingh-Onnes, have recently come to light to be in carbon-hydrogen and selenium organic compounds. This discovery, which has been made by the staff to which pertained the inventors of the present application, has been the object of a communication to the "Academie des Sciences" of Paris on 14th January 1980, published in the "Journal de Physique-Lettres", volume 290, 1980, serial B, pages 27 to 30, the contents of which as well as the literature are supposed to be integrated herein as a reference.

This publication relates to the existence of supraconduction at lower temperature (lower than 1° K.) in an organic conductor $(TMTSF)_2X$ where $X=PF_6$, (di-$\Delta^{2,2'}$-bi-4.5-dimethyl -1,3-diselenolhexafluorophosphate) shaped as crystals obtained by an electrochemical procedure when starting from ultrapure constituents. The compounds $(TMTSF)_2X$ have, shaped as monocrystals, a structure made of chains of organic stacked molecules, the ions X being staggered in stacks between the organic chains, as shown in FIG. 1 (wherein X shows $PF_6^-$). This structure has a highly conductive axis (vertical as shown in FIG. 1) enabling them to be designated as "molecular conductors having quasi-one-dimensional transfer property" (QID). When studying the compounds of said class, it has been seen that, whereas the critical temperature below which is established a nil resistant state, is in the range of $T_{c3}=1°$ K.), previous supraconductive signs, designated as "supraconductive fluctuations" may be observed within a temperature range extending up to 40° K. FIG. 2 shows a comparison between the thermal variation of the resistance of a usual supraconductive metal (curve I) (occurring as lead) at low temperature and that of a quasi-one-dimensional conductor QID of the stated type (curve II). The slight resistance and the high dependence in temperature of the compound QID must be accurately awarded to the above-mentioned supraconductive fluctuation.

Besides, it is known that long researches have enabled to manufacture intermetallic conductors, based for instance on Nb, Al, Ge, having a supraconductivity up to 23.2° K., i.e. with a too slight gap with respect to the temperature of liquid hydrogen (20° K.), as to forecast, on purpose to use them, that liquid hydrogen should be substituted for liquid helium, the many disadvantages of which, (as regards the manufacture costs as well as the storage thereof) are well known of the experts in cryogenic procedures.

Thus, there exists, especially in view of the large use field forecasts for the supraconductors, a very marked need to have compounds provided with supraconductive properties at temperatures higher than that of liquid helium and, better, higher than that of liquid hydrogen.

The object of the present invention is precisely to provide a process of increasing the critical supraconductive temperature in quasi-unidimensional organic supraconductive compounds on purpose to render them supraconductive while far away from usual critical temperature $T_{c3}$ of the compounds.

Another object of the present invention is to provide new compounds of the considered type, having supraconductibility properties in liquid hydrogen.

For this aim, according to a feature of the present invention, the process comprises the step of cross-linking the chains of such a molecular conductive compound having quasi-one-dimensional transfer properties with foreign atoms from at least one potentially conductive body.

According to another feature of the present invention, the process comprises the step of diffusing in a compound $(TMTSF)_2X$, wherein X is selected among the group consisting of $ClO_4$, $PF_6$, $TaF_6$, $SbF_6$, $AsF_6$, $ReO_4$, $NbF_6$, atoms from either metallic or semi-conductive bodies.

Other features and advantages of the present invention will become apparent from the following description made in relation with the accompanying drawings in which:

FIG. 1 diagrammatically shows a crystalline structure of a molecular conductor having quasi-one-dimensional transfer properties, related by the process according to the invention;

FIG. 2 is a curve establishing the comparison between the thermic variations of the resistance of a supraconductive metal and that of such quasi-one-dimensional conductor;

FIG. 3 diagrammatically shows a Schottky junction or contact mounting used for revealing the supraconductive properties of a $(TMTSF)_2X$ substrate;

FIG. 4 diagrammatically shows in macro-cross-section the interface of such a junction explaining the process of the invention;

FIG. 6 shows the differential resistant variations of a similar junction $(TMTSF)_2ClO_4$-GaSb as a function of the polarisation and the application of radio-frequency radiation; and FIG. 7 is a similar curve for the same junction showing the persistence of supraconductive properties up to 29° K.

The inventors have demonstrated that the supraconductive fluctuation phenomena which appeared below 40° K. in the molecular conductors having quasi-one-dimensional transfer properties (QID) resulted from the formation along the organic molecule chains of fluctuating elongated cigar-shaped fluctuating ephemerous limited supraconductive areas having a section $d^2$ (d being the distance between the stacks of organic molecular chains) and a length $\xi$, $\xi$ being the correlation length, and revealing a unidimensional critical temperature $T_{c1}$ considerably superior to the tridimensional critical temperature $T_{c3}$. The inventors have thus revealed the existence of an important forbidden energy gap at the Fermi level by electron transition by means of tunnelling effect in a Schottky type junction between a doped semi-conductor compound 2, to wit a N-doped GaSb, deposited as a thin layer of a crystalline substrate of a molecular compound having quasi-one-dimensional transfer properties and a thickness of 300μ. A tin layer is designated by reference 3, 4 being the electrodes. In fact, J. M. Rowell has found that the tunnelling effect is the most sensible detection system already known for determining a supraconductive state ("Tunnelling Phenomena in solids", published in 1969 by E. Burstein and S. Lundvist, Plenum Press). With the circuit shown in FIG. 3, a low-frequency modulated polarisation current is applied, the corresponding alternative voltage being measured with a phase synchronous sensor device. The dynamic resistance R=dV/dI of the tunnelling junction may thus be determined as a function of the polarisation (maintained lower than 20 millivolts). It has been established, in these conditions, that there is a less or more marked peak in the dV/dI-mV diagram about the nil polarisation value, with a forbidden $2\Delta$ equal to 3.6 millivolt ($2\Delta$ being in relation with the formation energy of a supraconductive electron pair on each molecular chain).

As previously stated, a quasi-one-dimensional supraconductive monocrystal of the $(TMTSF)_2X$ type may be considered as a slight coupled organic molecular chain lattice, wherein the inter-chain coupling may be compared to a very slight coupling of the Josephson type. The lower tridimensional critical temperature $T_{c3}$ of these compounds (in the range of 1° K.) is caused by this slight coupling. In the temperature ranged between 1° K. and 40° K., the electronic properties of such an organic molecular supraconductor may be compared to a pattern of substantially uncoupled quasi-one-dimensional supraconductive chains. The inventors have thus tried to improve the chain coupling, i.e. to form conductive bridges between the latter as to "quench" by means of cross-linking said chains the presupraconductive condition observed up to 40° K. under the form of supraconductive fluctuation previously stated.

Figure 4:
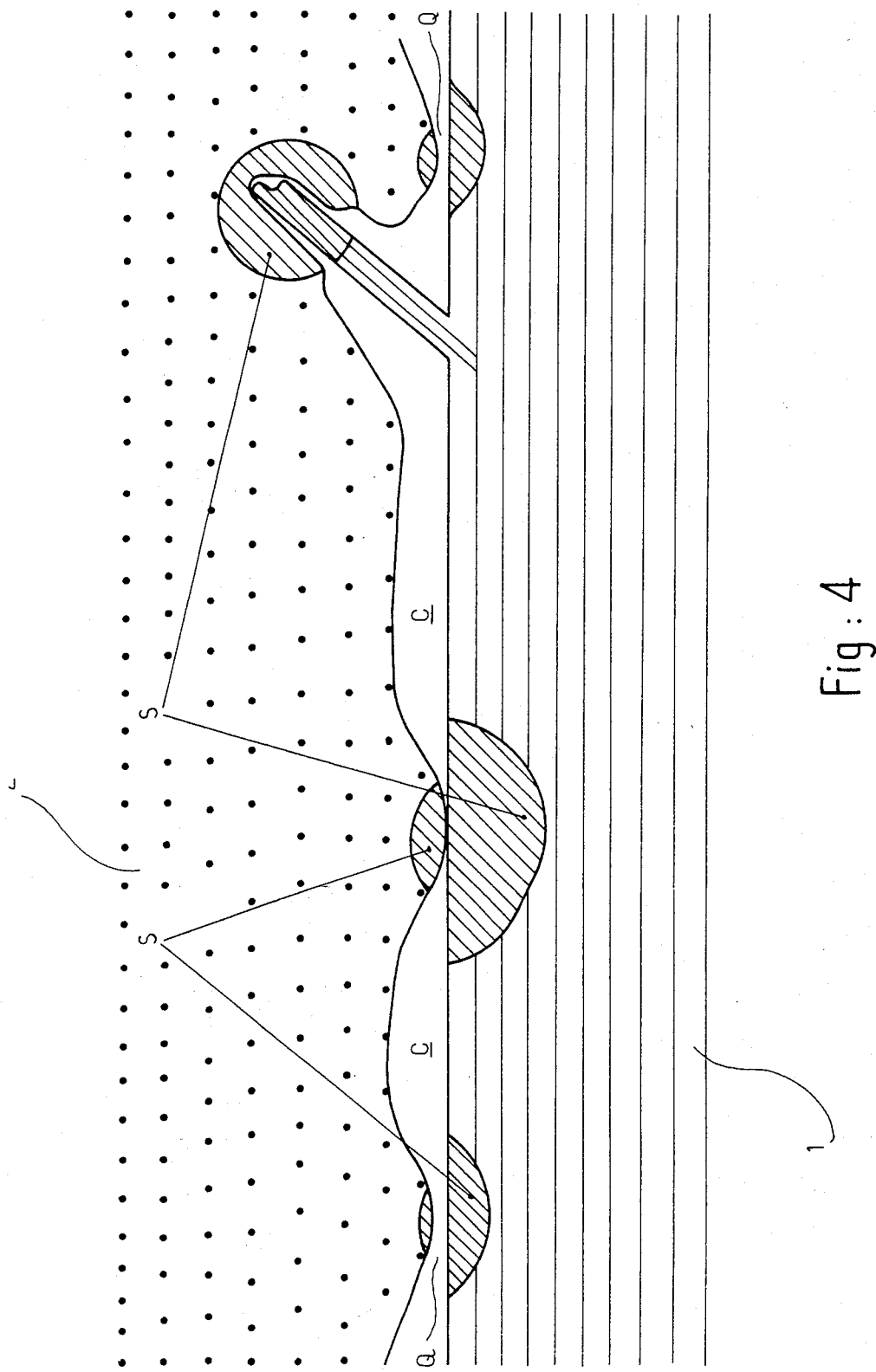
Figure 5:
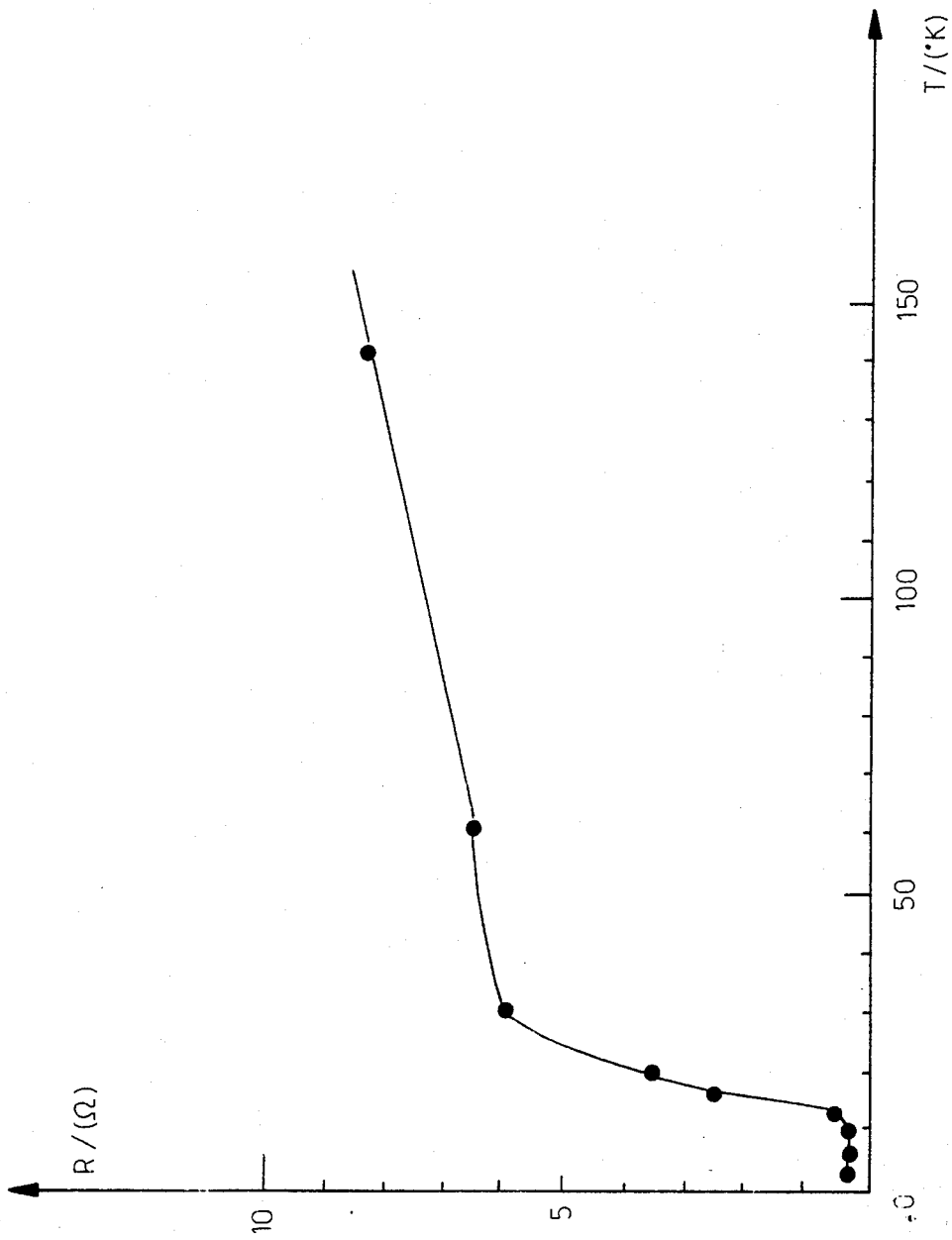
FIG. 5 shows the variation curve of the nil dynamic differential resistance under polarisation of such a junction $(TMTSF)_2PF_6$-GaSb at the level of areas S on the interface in FIG. 4.

It has been found that this cross-linking or bridging for improving the cross-sectional supraconductive coupling strength may be attained by inserting foreign atoms of a pseudo-metallic or metallic potentially conductive body between the chains, which has been effectively demonstrated by experiments with the Schottky junction shown in FIG. 4 (contact $(TMTSF)_2PF_6$-GaSb)) and plotted on FIG. 5. In a tunnelling junction of this type, there is normally a gate conventional interface (areas C) of 10 to 30 Angstroms of thickness, thus establishing a contact of the supraconductive-isolating-conductive type (NIS). However, this gate is caused to be destroyed in situ by the diffusion or precipitation of an excess of atoms of the semi-conductive compound 2 (in this case Sb atoms) in the supraconductive substrate 1, as shown by the hatched areas S on FIG. 4. In said areas, the individual chains of organic molecules TMTSF become more strongly coupled due to the fact that foreign atoms are included therein, the normally one-dimensional property of supraconductibility beyond the critical temperature $T_{c3}$ in these areas thus becoming tridimensional and implying an increase of the tridimensional critical temperature $T_{c3}$ at the level of the unidimensional critical temperature $T_{c1}$. The tridimensional supraconductive stabilized areas in the substrate 1 induce limited supraconductive areas in the adjacent semiconductor compound by effect of proximity through the slight isolating Schottky gate. It results that the quasi-contact areas, such as Q (supraconductive-isolating-supraconductive junction-SIS) have thus the feature of a Josephson junction.

FIG. 5 establishes the variation curve of the dynamic resistance of such a junction $(TMTSF)_2PF_6$-GaSb at a pressure of 11 kilobars. It appears that the contact becomes supraconductive below 12° K. (the residual resistance of the range of 0.02 ohm at very low temperatures corresponds to the serial resistances of the electrode contacts and of the substrate mass of the organic molecular conductor remaining in the pattern of quasi-one-dimensional supraconduction, the resistance being really nil below the critical point $T_{c3}$.

The inventors have found that the forbidden energy gap at the Fermi level of the compounds $(TMTSF)_2X$ was not highly modified by the nature of the anion X, but as a general rule, the forbidden gap $2\Delta$ would decrease when the applied pressure would increase. This forbidden gap thus constitutes an inherent property of the stacked organic chains of the TMTSF molecules, the experiments carried out with $(TMTSF)_2PF_6$ (at a very high pressure) remaining suitable for the other families of compounds where X is $PF_6$ as well as $AsF_6$, $TaF_6$, $SbF_6$, $ReO_4$, $NbF_6$ and especially $ClO_4$, the perchlorate anion having the considerable advantage of forming compounds having a high supraconductive critical temperature at ambient pressure.

Thus FIG. 6 shows the variations of dynamic resistance of a Schottky $(TMTSF)_2ClO_4$-GaSb contact under ambient pressure and at 8° K., with further intermittent application of radio-frequency radiation of 50 MHz (inferior contour 6 of peaks) or in the absence of this radio-frequency radiation (upper contour 7 of the peaks). The radiation consists of 10 nanoseconds impulses with a period of 20 nanoseconds applied to a resistance located close to the junction, but without any common connection with each other. The differential resistance for the areas of very slight voltage over a voltage range corresponding to $4\Delta=16$ millivolts is modified by the radio-frequency radiation. These modifications, due to the presence or the absence of a radio-frequency radiation, result from the existence of a supraconductive state in the organic chains of the molecular conductor and may be interpreted as a Josephson effect in the S-I-S areas hereinabove stated. The junction thus acts as a random lattice of Josephson junctions which are coupled in parallel, each junction having a resistor or a supraconductive state with a finished voltage drop. On FIG. 6, the curve corresponds to measures carried out at a temperature of 8° K., FIG. 7 establishing the absence of such variations of the differential resistance in the absence (7) or in the presence (6) of a radio-frequency having the same frequency for a temperature range extending up to 30° K. Beyond this temperature, the non-linear Josephson effect abruptly disappears.

It is thus demonstrated that, by "cross-linking" or bridging of the organic molecular chains, that is to say, according to the present invention, any conductive contact of the metallic type between the chains forming an easy passage for the electrons of a chain to another, one attains a tridimensional supraconductive state stabilized up to 30° K., to wit with a temperature latitude which is widely suitable for using these components in their tridimensional supraconductive state with liquid hydrogen (20° K.), that was not substantially the case with supraconductive inter-metallic conductors up to a maximum of 23.2° K.

More generally, an increase of the critical superconductive temperatures in the quasi-one-dimensional organic supraconductors of the considered type may thus be obtained by cross-linking the stacks of molecular chains by means of foreign atoms of at least a potentially conductive body. This insertion of foreign atoms may be carried out easily by diffusion, for example by deposit via vacuum evaporation of foreign atoms, for example of antimony, arsenic, silver, gold, aluminum, lead or indium. Thus, the foreign atoms diffused into the organic crystal between the conductive chains for providing the designed increase of inter-chain coupling.

The monocrystals of $(TMTSF)_2X$ normally crystallised as rigid needles and it has been found that the same phenomena of Josephson effect and effects of a radio-frequency have been observed on very thin junctions which are formed between a metallic area and the ends of the organic chains. This end metallic contact insures between the initially individual conductive chains a sufficient coupling for inducing a supraconductive transition of the chains at a temperature close to 30° K. along a thickness $\xi$ in the range of 100 to 1000 Å. The nature of the contact metal is not critical (molybdene, niobium, tantale, aluminum, lead, indium, tin, gallium or alloys such as $Nb_3Sn$ or Nb-Al-Ge alloys). The tridimensional critical temperature $T_{c3}$ initially rises with the concentration of conductive atoms insuring the end contact between chains, but attains a maximal value in the range of $T_{c1}$ for a concentration of conductive atoms in the range of 5 to 15%.

Thus, according to this other procedure, an electrochemical deposit of monocrystals of these compounds may be accordingly forecast on an electrode, for example of silver, on which have been previously deposited foreign atoms to be diffused, for example by electrochemical deposit or by evaporation. On this first crystalline substrate of a thickness in the range of 100 to 1000 Å, the deposit may be carried out, for instance by evaporation of another metallic layer of foreign atoms, having a thickness of 10 to 50 Å, and as long as the other electrode is formed by a deposit or a direct contact with gold, antimony, silver, GaSb, aluminum, lead or indium on the substrate of alternated layers. The organic supraconductive chains which are perpendicular to the surface areas of potentially conductive bodies providing foreign atoms or forming a high angle with respect to the latter, have their supraconductivity considerably improved by diffusion of these foreign atoms from one side to the other between the chains of adjacent substrates and by the end coupling of the chains by means of the metallic layers on purpose to stabilize the tridimensional supraconductive crystalline compounds with a critical temperature in the range of 29° K.

The Josephson devices based on these compounds may accordingly be utilised in all the uses generally provided for the Josephson devices and notably as detectors or generators in the intermediary area between the hyperfrequencies and the very remote infrared (up to 4000 GHz) where the usual metallic or inter-metallic supraconductors can no longer operate. Besides, the supraconductive compounds according to the invention may remain supraconductive under very high magnetic fields.

Although the present invention was described in relation with particular embodiments, it is not limited but on the contrary liable to be modified and varied as it would appear to those skilled in the art.

We claim:

1. A process for increasing the critical supraconductive temperature of the organic molecular crystalline compound $(TMTSF)_2X$ in which TMTSF is di-$\Delta^{2,2'}$-bi-4,5-dimethyl-1,3-diselenol and X is $ClO_4$, $PF_6$, $TaF_6$, $SbF_6$, $AsF_6$ or $ReO_4$ comprising cross-linking the chains of the crystalline compound with at least one metal selected from gold, silver, aluminum, lead, indium, gallium or selenium.

2. The process of claim 1 in which the metal atoms are diffused between the chains of the crystalline compound.

3. The process of claim 2 in which the diffusion is by vacuum evaporation.

4. The process of claim 1 in which X is perchlorate $ClO_4$.

5. The process of claim 1 in which the metal is antimony.

6. A supraconductive compound produced by the process of claim 1.

* * * * *